United States Patent
Kalavade et al.

(10) Patent No.: US 9,043,681 B2
(45) Date of Patent: May 26, 2015

(54) RECONSTRUCTING CODEWORDS USING A SIDE CHANNEL

(75) Inventors: Pranav Kalavade, San Jose, CA (US); Ravi H. Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 13/996,151

(22) PCT Filed: Mar. 28, 2012

(86) PCT No.: PCT/US2012/031032
§ 371 (c)(1), (2), (4) Date: Jun. 20, 2013

(87) PCT Pub. No.: WO2013/147775
PCT Pub. Date: Oct. 3, 2013

(65) Prior Publication Data
US 2013/0318395 A1    Nov. 28, 2013

(51) Int. Cl.
*H03M 13/00* (2006.01)
*G06F 11/14* (2006.01)
*H03M 13/11* (2006.01)
*H03M 13/29* (2006.01)
*G06F 11/10* (2006.01)

(52) U.S. Cl.
CPC ....... *G06F 11/1412* (2013.01); *H03M 13/1102* (2013.01); *H03M 13/2906* (2013.01); *H03M 13/2927* (2013.01); *G06F 11/1044* (2013.01)

(58) Field of Classification Search
CPC ............................. H04L 1/005; H03M 13/255
USPC .................................................. 714/774, 763
See application file for complete search history.

(56) References Cited

U.S. PATENT DOCUMENTS

| 8,438,462 | B2 * | 5/2013 | Liva ............................... 714/786 |
| 8,566,678 | B2 * | 10/2013 | Eidson et al. ................. 714/780 |
| 2006/0222121 | A1 | 10/2006 | Uchikawa et al. |
| 2008/0022189 | A1 * | 1/2008 | Vityaev et al. ................ 714/770 |
| 2008/0059868 | A1 | 3/2008 | Cai et al. |
| 2008/0069242 | A1 * | 3/2008 | Xu et al. .................. 375/240.24 |
| 2010/0199149 | A1 | 8/2010 | Weingarten et al. |
| 2011/0035647 | A1 * | 2/2011 | Eidson et al. ................. 714/780 |
| 2011/0219284 | A1 | 9/2011 | Uchikawa et al. |

OTHER PUBLICATIONS

International Search Report and Written Opinion for PCT/US2012/031032, mailed Nov. 29, 2012, 6 pages.
International Preliminary Report on Patentability for PCT/US2012/031032 mailed Oct. 9, 2014, 5 pages.

* cited by examiner

*Primary Examiner* — M. Mujtaba K Chaudry
(74) *Attorney, Agent, or Firm* — Schwabe, Williamson & Wyatt, P.C.

(57) ABSTRACT

Embodiments of the present disclosure describe device, methods, computer-readable media and system configurations for decoding codewords using a side channel. In various embodiments, a memory controller may be configured to determine that m of n die of non-volatile memory ("NVM") have failed iterative decoding. In various embodiments, the memory controller may be further configured to generate a side channel from n-m non-failed die and the m failed die other than a first failed die. In various embodiments, the memory controller may be further configured to reconstruct, using iterative decoding, a codeword stored on the first failed die of the m failed die based on the generated side channel and on soft input to an attempt to iteratively decode data stored on the first failed die. In various embodiments, the iterative decoding may include low-density parity-check decoding. Other embodiments may be described and/or claimed.

25 Claims, 9 Drawing Sheets

RECONSTRUCTING CODEWORDS USING A SIDE CHANNEL

CROSS REFERENCE TO RELATED APPLICATION

The present application is a national phase entry under 35 U.S.C. §371 of International Application No. PCT/US2012/031032, filed Mar. 28, 2012, entitled "RECONSTRUCTING CODEWORDS USING A SIDE CHANNEL," which designates, among other states, the United States of America and the entire contents and disclosures of which are hereby incorporated by reference in their entireties.

FIELD

Embodiments of the present disclosure relate generally to the field of data processing, and more particularly, to reconstructing codewords using a side channel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

A memory controller of non-volatile memory ("NVM") may use a variety of data encoding/decoding techniques to handle bit errors and recover data. For example, data may be encoded as one or more codewords, e.g., as low-density parity-check ("LDPC") codewords. The memory controller may include an iterative LDPC decoder configured to decode the LDPC codewords.

Some types of codewords, such as LDPC-encoded codewords, may include an original message and associated parity data. A non-binary iterative decoder (e.g., an LDPC decoder) may process the codeword multiple times during decoding. Symbols and soft information (e.g., associated probabilities that the symbols are correct) may be passed between variable nodes and check nodes corresponding to relationships between the variable nodes. Each iteration may bring the codeword closer to the original message.

NVM may include a plurality of physical components, such as a plurality of die. If a single die fails, it may be possible to reconstruct data from the failed die using data from the other, non-failed die. However, reconstructing data on multiple die may be less successful.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smart phone (which may include one or more processors), a tablet, laptop computer, a set-top box, a gaming console, and so forth.

Figure 1:
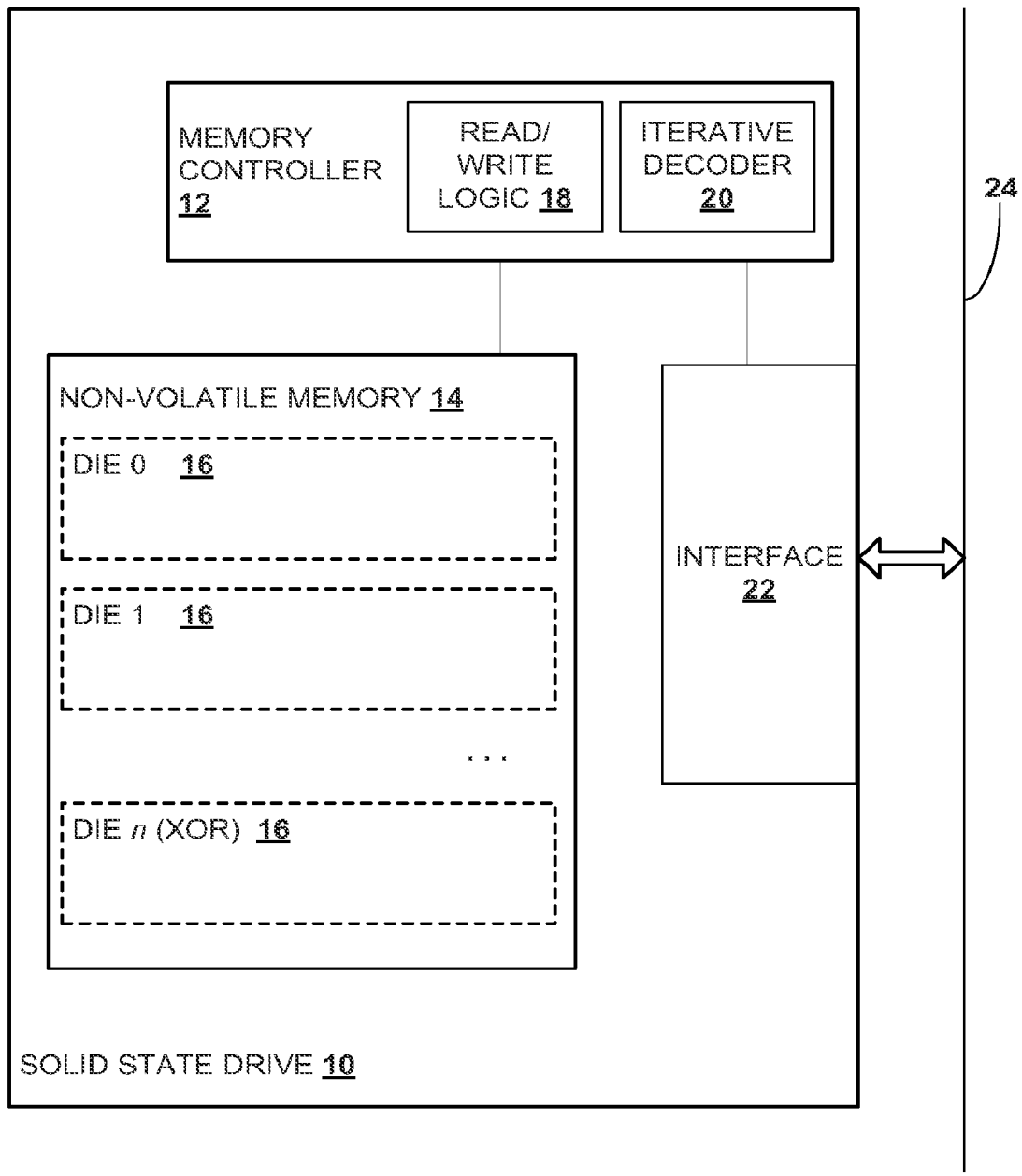
FIG. 1 schematically illustrates an example solid state drive, in accordance with various embodiments.

Referring now to FIG. 1, an example storage device 10, shown here in the form of a solid state drive ("SSD"), may include a memory controller 12 operably coupled to non-volatile memory ("NVM") 14. In various embodiments, memory controller 12 may be implemented using hardware (e.g., a digital circuit). In some embodiments, NVM 14 may be NAND flash memory. In various embodiments, NVM 14 may be other types of NVM, such as ferroelectric random-access memory ("FeTRAM"), nanowire-based NVM, phase change memory ("PCM"), PCM with switch ("PCMS"), and so forth. In various embodiments, memory device 10 may be other types of storage devices, such as a hard disk drive ("HDD"). NVM 14 may include various numbers of die 16. In the example of FIG. 1, NVM 14 includes n die 16, DIE 0-DIE n. In this example, DIE n is an XOR die.

In various embodiments, memory controller 12 may include read/write logic 18 and an iterative decoder 20. Read/write logic 18 may be configured to read data from NVM 14 and write data to NVM 14. As will be discussed below, data may be read from NVM 14, e.g., by read/write logic 18, in various ways, including so-called "hard reads" and "soft reads." Iterative decoder 20 may be configured to, among other things, decode codewords on the n die 16. In various embodiments, iterative decoder 20 may be an LDPC decoder, such as a non-binary LDPC decoder.

In various embodiments, memory device 10 may be configured to be coupled to a host computing device (not shown), such as various computing and/or consumer electronic devices/appliances, including but not limited to desktop, laptop, or tablet computers. To that end, an interface 22 may comprise any suitable interface for coupling the memory device 10 to the host computing device, such as, for example, but not limited to, a Serial Advanced Technology Attachment ("SATA") interface, a serial attached SCSI ("SAS") interface, a universal serial bus ("USB") interface, a peripheral control interface ("PCI"), or other suitable device interface. In various embodiments, interface 22 may operably couple memory device 10 to a bus 24, which in turn may be operably coupled to other components (not shown) of the host computing device. In various embodiments, bus 24 may be a SATA bus.

When reading data from the plurality of die 16, codewords stored on each die 16 may be decoded, e.g., by iterative decoder 20 in FIG. 1. If an attempt to iteratively decode data stored on one die 16 fails but attempts to iteratively decode data stored on the remaining die are successful, in many cases, undecoded codewords from the non-failed die 16 may simply be XOR'd to reconstruct a codeword on the failed die 16. However, if more than one die 16 fails, then it is not possible to reconstruct data stored on the failed die 16 using the XOR results of the non-failed die 16 alone.

Figure 2:
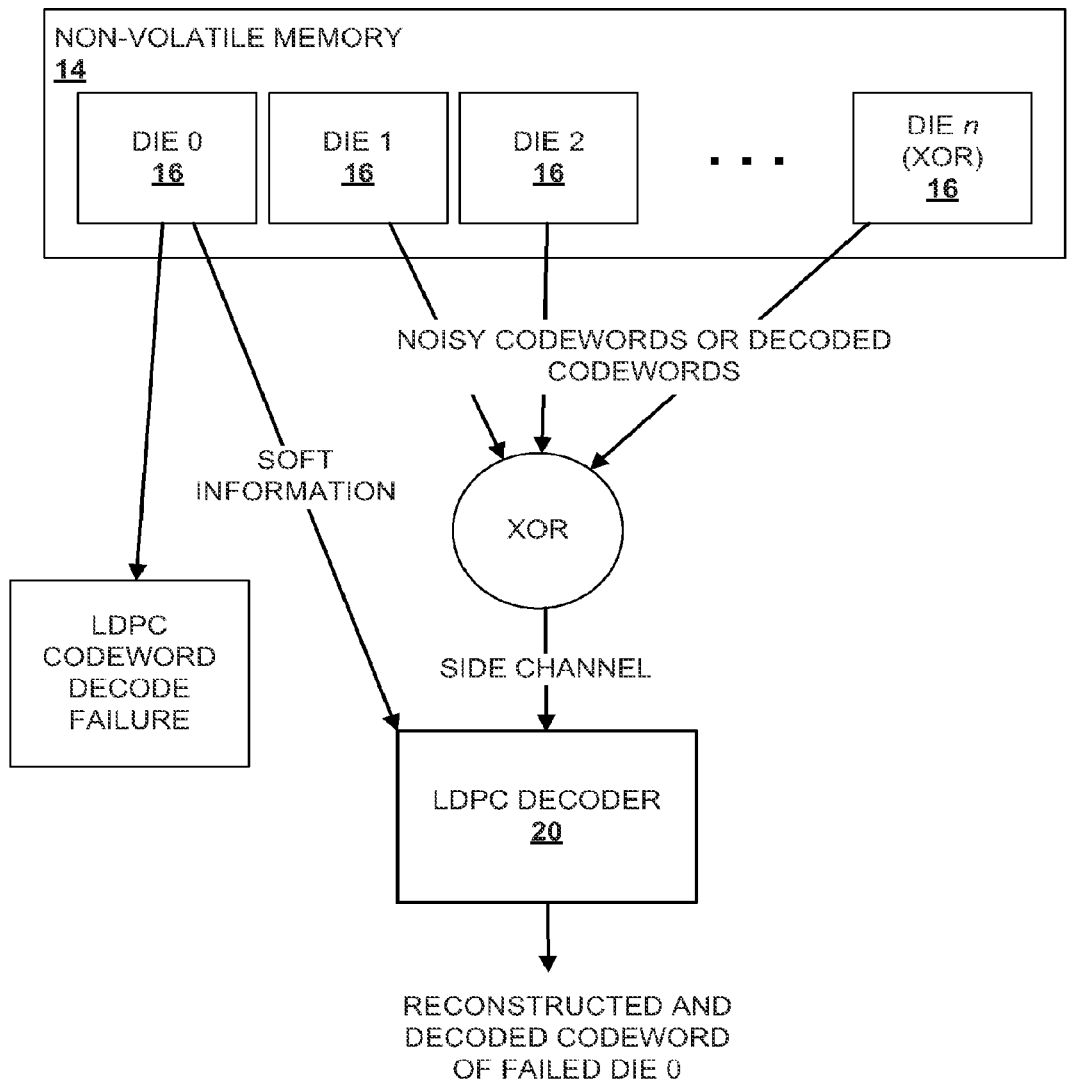
FIG. 2 schematically illustrates how various types of data associated with multiple die may be input to an iterative decoder, in accordance with various embodiments.

Accordingly, in various embodiments and as depicted in FIG. 2, after determining that m of n die have failed, m being an integer greater than 1, an iterative decoder (e.g., 20) may be configured to reconstruct a codeword stored on a first failed die 16 (e.g., DIE 0 in FIG. 2). This may be done using soft input to an unsuccessful attempt to iteratively decode data stored on the first die (DIE 0) and a side channel generated from n-m non-failed die and the m failed die other than DIE 0. In various embodiments, the same iterative decoder 20 may be used to reconstruct a codeword on a failed die, as shown in FIG. 2, as was used initially to attempt to decode codewords on all the die 16. In other embodiments, there may be separate iterative decoders to perform these separate operations.

"Hard information" may refer to one or more values of a bit or group of bits. "Soft information" may refer to a likelihood that hard information associated with a bit or group of bits is correct (e.g., a confidence level). In various embodiments, soft information may be expressed in logarithmic form. For individual bits, soft information may be expressed as log likelihood ratios, or "LLR." For multiple bits, soft information may be expressed as log density ratios, or "LDR."

A "side channel" may include a variety of information. As shown in FIG. 2, in various embodiments, the side channel may be generated by XORing, bit-by-bit, bits associated with attempts to iteratively decode data stored on various die to generate a side channel codeword. Once the side channel codeword is generated, it may be input, along with soft input associated with attempts to iteratively decode data stored on the failed die under consideration (e.g., DIE 0), to an iterative decoder such LDPC decoder 20 in FIG. 2.

In various embodiments, the side channel may be generated using an XOR result of one or more of hard output of one or more successful attempts to iteratively decode data stored on the n-m non-failed die, soft output of one or more successful attempts to iteratively decode data stored on the n-m non-failed die, hard output of one or more unsuccessful attempts to iteratively decode data stored on the m failed die other than the first failed die, and/or soft output of one or more unsuccessful attempts to iteratively decode data stored on the m failed die other than the first failed die.

"Soft output" may refer to soft information output from an attempt to iteratively (e.g., LDPC) decode data stored on a die. For example, an iterative decoder such as LDPC decoder 20 may output a series of LLRs. Each LLR may represent a likelihood or confidence level that a particular bit is a zero or a one, and the sign of the LLR may represent the actual bit value (zero or one). In various embodiments, if the sign of an LLR is negative, the corresponding bit holds a one, and if the sign of the LLR is positive, the corresponding bit holds a zero.

"Hard output" may refer to hard information determined from soft output from an attempt to iteratively (e.g., LDPC) decode data. In various embodiments, hard output of an unsuccessful attempt to iteratively decode data stored on a failed die may have a lower raw bit error rat ("RBER") than the RBER associated from the failed die, e.g., as a result of an attempt to LDPC decode the codeword.

FIGS. 3-7 depict examples of how various data associated with attempts to iteratively decode data stored on die may be used to generate a side channel. In each example, assume that attempts to iteratively decode (e.g., using LDPC) data stored on m of n die, including DIE 0 and DIE 2, have failed. Assume also that in each example, DIE 0 is the die under consideration, e.g., the die for which data is being reconstructed.

The blocks denoted X26 (e.g., 326 in FIG. 3, 426 in FIG. 4, etc.) represent attempts to iteratively decode data stored on a particular die. The die are not shown but would be to the left. Inputs to the attempts X26 to iteratively decode the die are shown as arrows leading into the blocks X26 from the left. Outputs are shown as arrows leading from the blocks X26 to the right.

Before using techniques described herein, in various embodiments, an iterative decoder (e.g., LDPC decoder X20 in FIGS. 3-7) may first attempt to decode a codeword on each die using "hard input." "Hard input," may refer to data that is "hard read" from the die, which means a single read reference voltage was applied to each cell (e.g., a NAND cell) of the die. The result is "hard information"; e.g., an SLC cell holds either a zero or one, with no information about the probability that the value is correct.

If the attempt X26 to iteratively decode data stored on a die using hard input is unsuccessful, then in various embodiments, an iterative decoder (e.g., LDPC decoder X20 in FIGS. 3-7) may next attempt to decode a codeword on each die first using "soft input." "Soft input," may refer to data that is "soft read" from the die, which means multiple read reference voltages were applied to each cell of the die. The result is "soft information"; e.g., values stored in the cells and probabilities that those values are correct (e.g., "confidence levels"). Due to the additional read reference voltages, a soft input or read may take longer than a hard input or read.

If either of the attempts to iteratively decode data of a die using hard or soft input is successful, and assuming a cyclic redundancy check ("CRC") is correct, then the soft or hard output of the successful attempt to decode the die may be treated as correct. As will be described below, this "correct" hard/soft output may be used with other data to generate a side channel for reconstructing data on failed die. In FIGS. 3-7, where attempts X26 to iteratively decode data on a die are successful, the input arrows entering the blocks X26 from the left are denoted "HARD/SOFT INPUT" because it may not matter which type of input was used, so long as the iterative decode attempt was successful.

Figure 3:
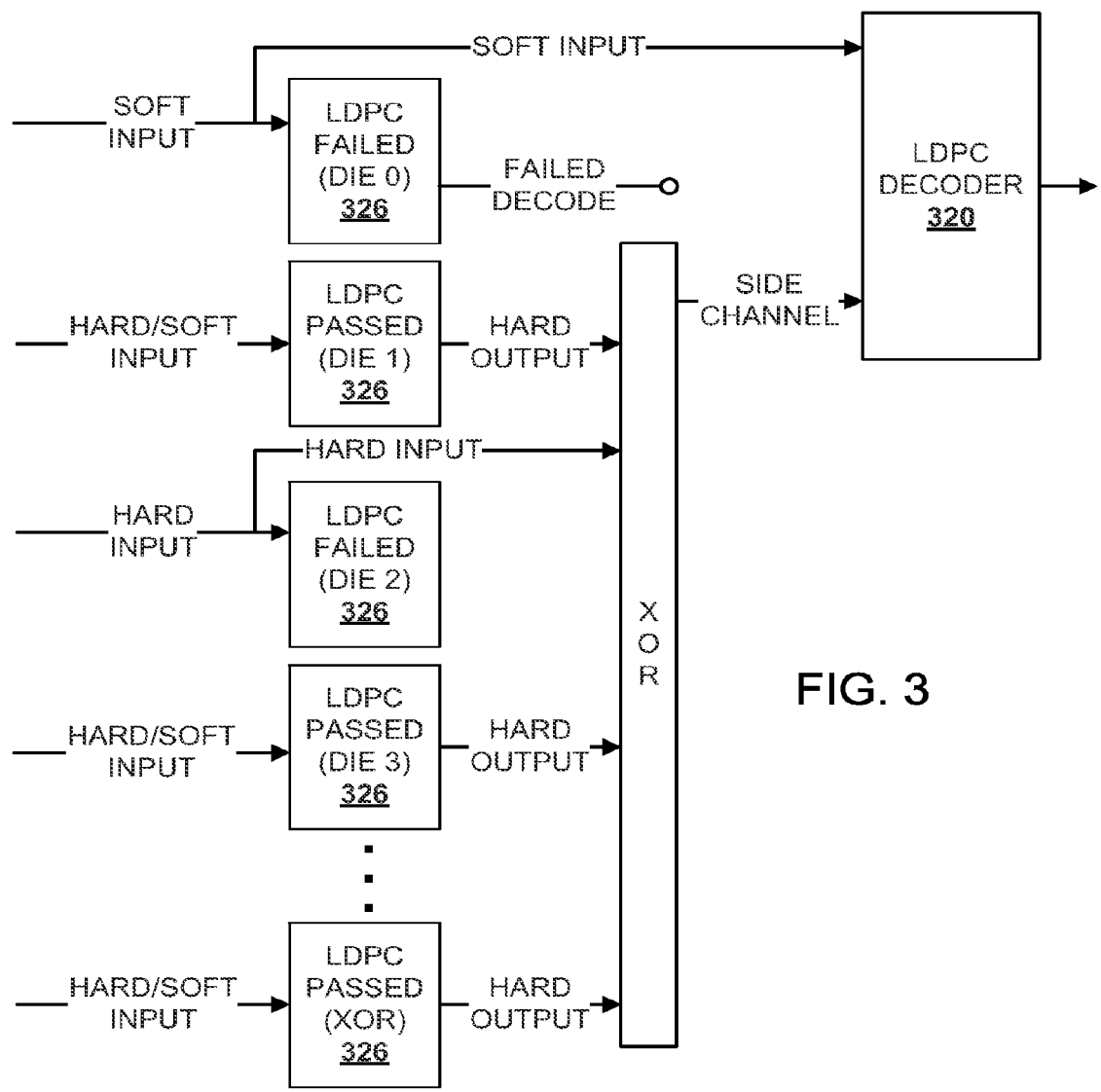
FIGS. 3-7 schematically illustrate various examples of how various types of data associated with attempts to iteratively decode data stored on multiple die may be input to an iterative decoder, in accordance with various embodiments.

In FIG. 3, the side channel is generated using hard output from successful attempts 326 to iteratively decode data stored on the n-m non-failed die. The side channel is further generated using hard input to unsuccessful attempts 326 to iteratively decode data stored on the m failed die other than the first die. For example, if an LDPC decode of a codeword on a die is successful and a CRC of the die also passes, bits output from the LDPC decode may be used as input for the XOR.

However, in FIG. 3, if either the LDPC decode attempt or the CRC fails, then hard input for the LDPC decode attempt of that die is used as input for the XOR instead. In FIG. 3, an example of this is seen where the LDPC decode attempt 326 of DIE 2 failed, and hard input to that LDPC decode is used instead. Thus, the side channel in FIG. 3 includes an XOR result of hard output of successful attempts to iteratively decode data stored on n-m non-failed die, and hard input to unsuccessful attempts to iteratively decode data stored on the m failed die other than the first die. In various embodiments, instead of hard input, soft input to an unsuccessful attempt to iteratively decode data on a failed die other than the first failed die may be used instead.

In various embodiments, the side channel may also have an effective RBER. In various embodiments, the effective RBER of the side channel may be computed based on output RBER of each of the n-m non-failed die 326 and/or the m failed die. In various embodiments, the side channel and its effective RBER may be used as input for an LDPC decoder 320, along with soft input to an unsuccessful attempt to iteratively decode data stored on the first failed die 326 (e.g., DIE 0).

Figure 4:
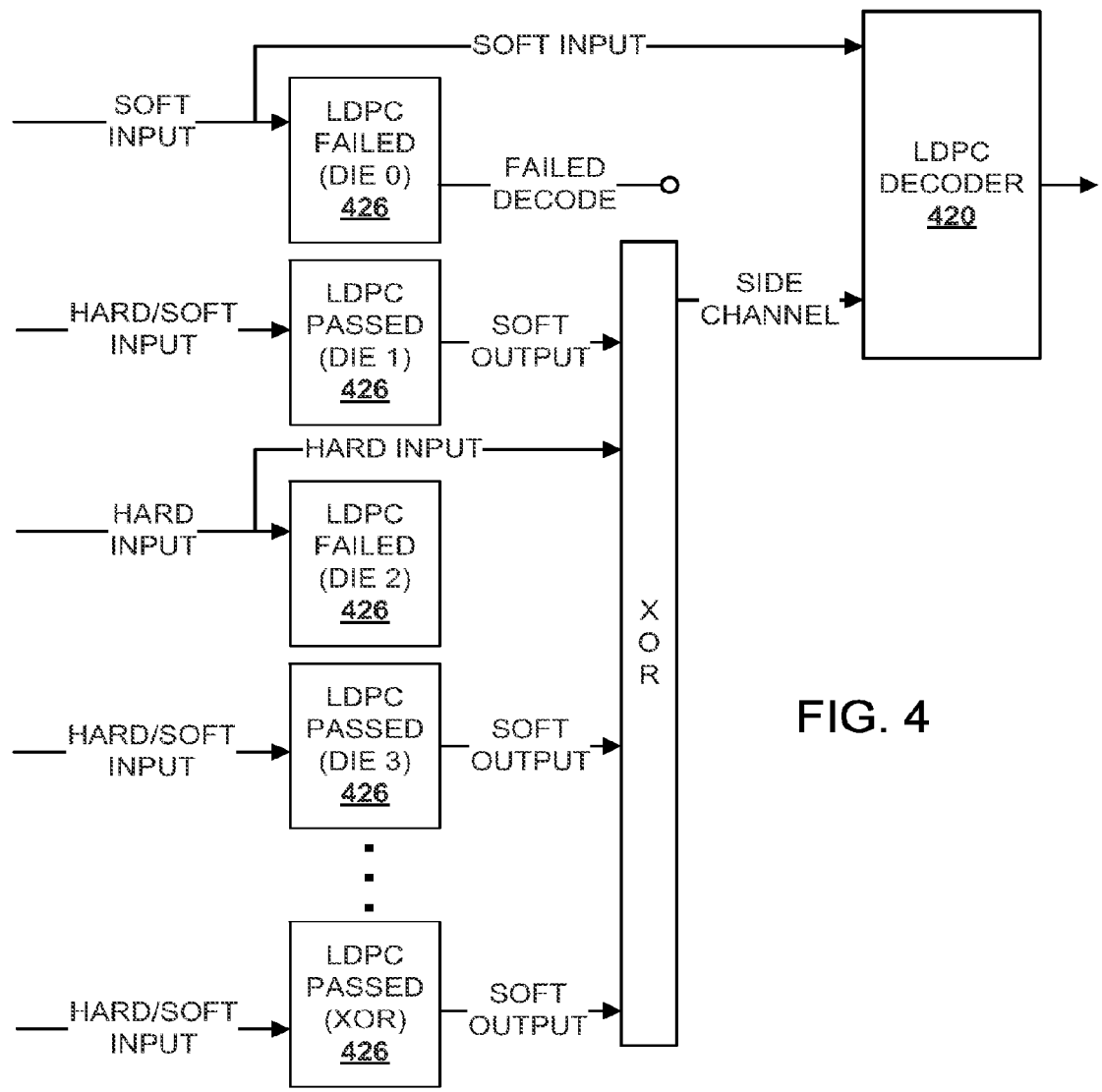

The example of FIG. 4 is similar to that of FIG. 3, except that the side channel is generated using soft output, rather than hard output, of successful attempts 426 to iteratively decode data stored on the n-m non-failed die. The side channel in FIG. 4 is an XOR result of both this and hard input to unsuccessful attempts to iteratively decode data stored on the m failed die other than the first failed die (e.g., DIE 2).

Figure 5:
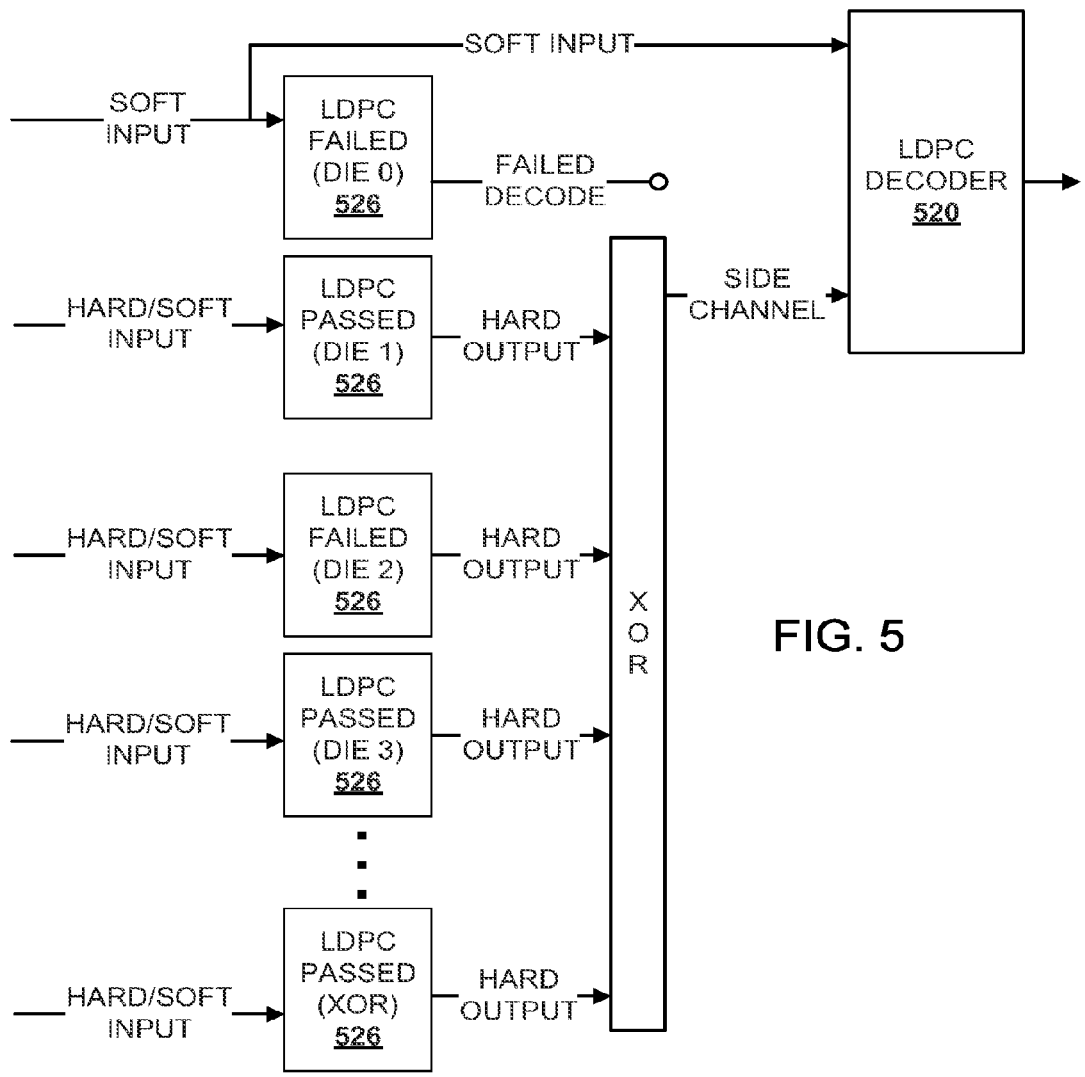

In FIG. 5, hard output of both successful and unsuccessful attempts 526 to iteratively decode data stored on all die other than the first failed die (DIE 0), including the m failed die (e.g., DIE 2), is used to generate the side channel. The RBER of output of even an unsuccessful attempt to iteratively decode data stored on a die may be lower than an RBER of the failed die itself.

Figure 6:
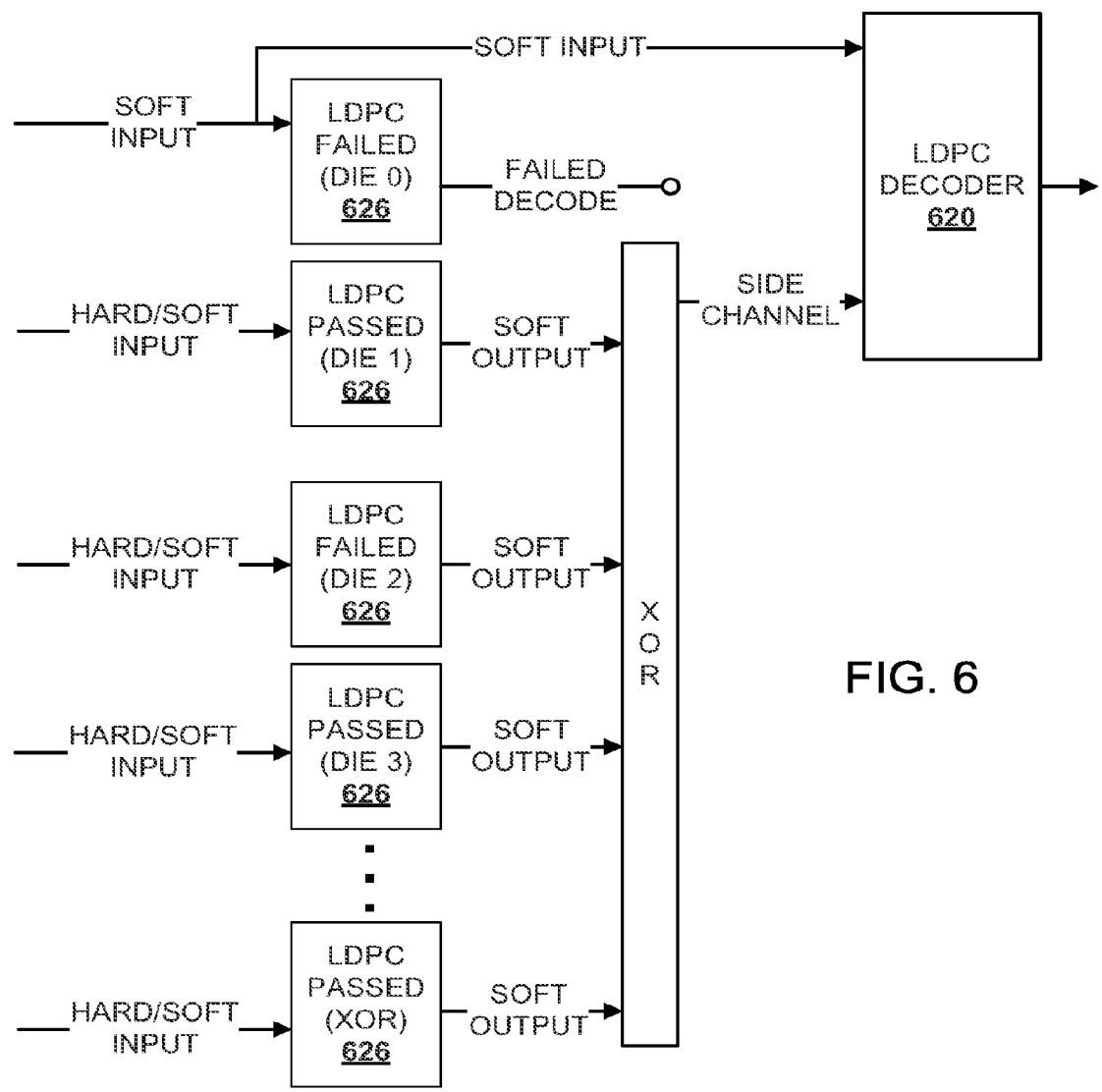

FIG. 6 is similar to FIG. 5, except that soft output of both successful and unsuccessful attempts 626 to iteratively decode data stored on all die other than the first failed die (DIE 0), including the m failed die (e.g., DIE 2), is used to generate the side channel. As was the case with FIG. 5, the RBER of output of even an unsuccessful attempt to iteratively decode data stored on a die may be lower than an RBER of the failed die itself.

Figure 7:
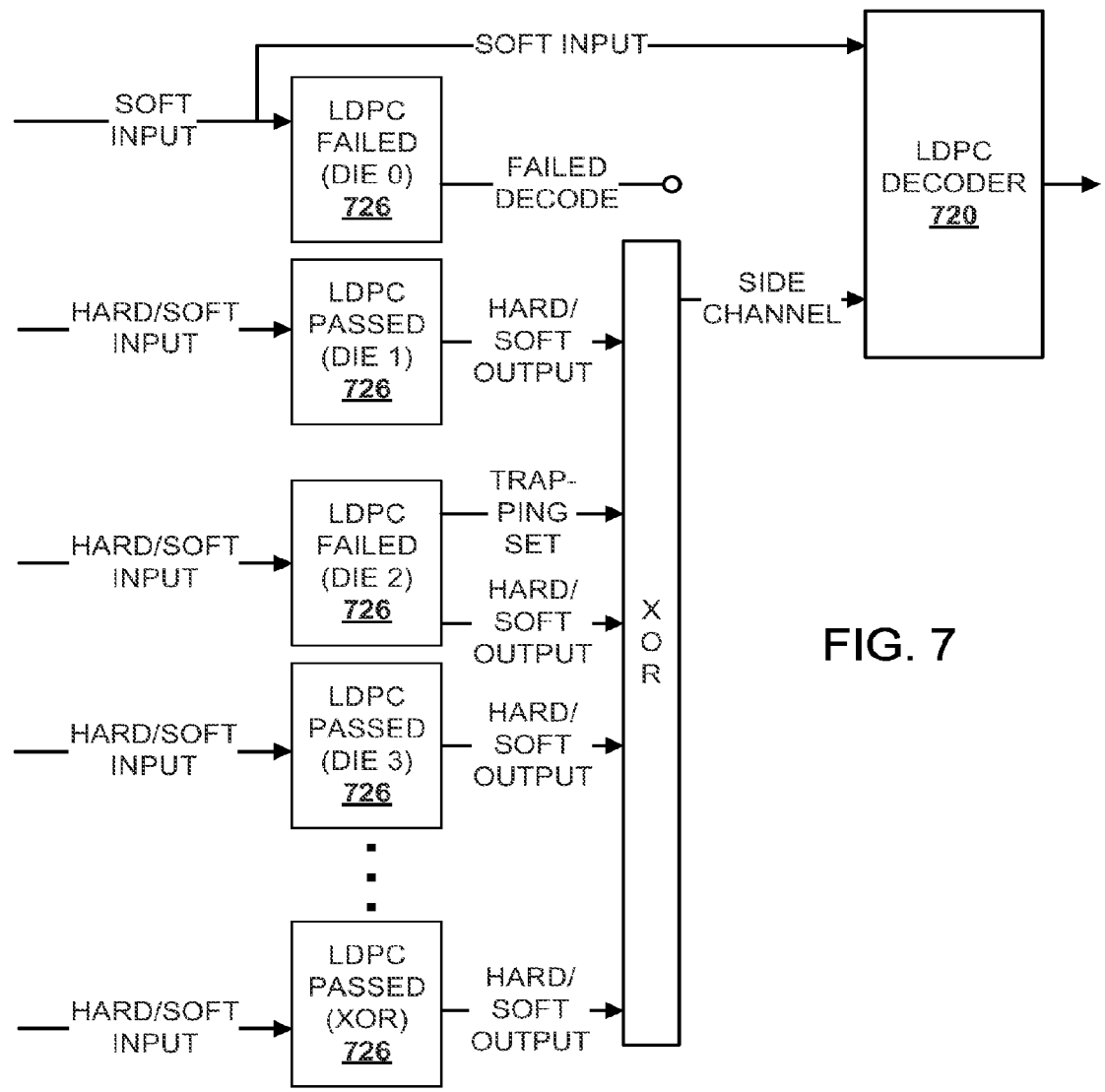

In FIG. 7, the side channel is generated using soft or hard output of both unsuccessful and successful attempts 726 to iteratively decode data stored on the n-m non-failed die and the m failed die (e.g., DIE 2) other than the first failed die (DIE 0). In addition, in FIG. 7, information about trapping sets associated with unsuccessful attempts 726 to iteratively decode data stored on one or more of the m failed die is used to generate the side channel. A "trapping set" may refer to a collection of variable nodes or symbols that do not converge correctly during LDPC decoding. Trapping sets may be used by the LDPC decoder 720, in addition to other side channel data and soft input to an unsuccessful attempt to iteratively decode data stored on the first failed die (DIE 0) under consideration, to reconstruct the codeword from DIE 0.

Figure 8:
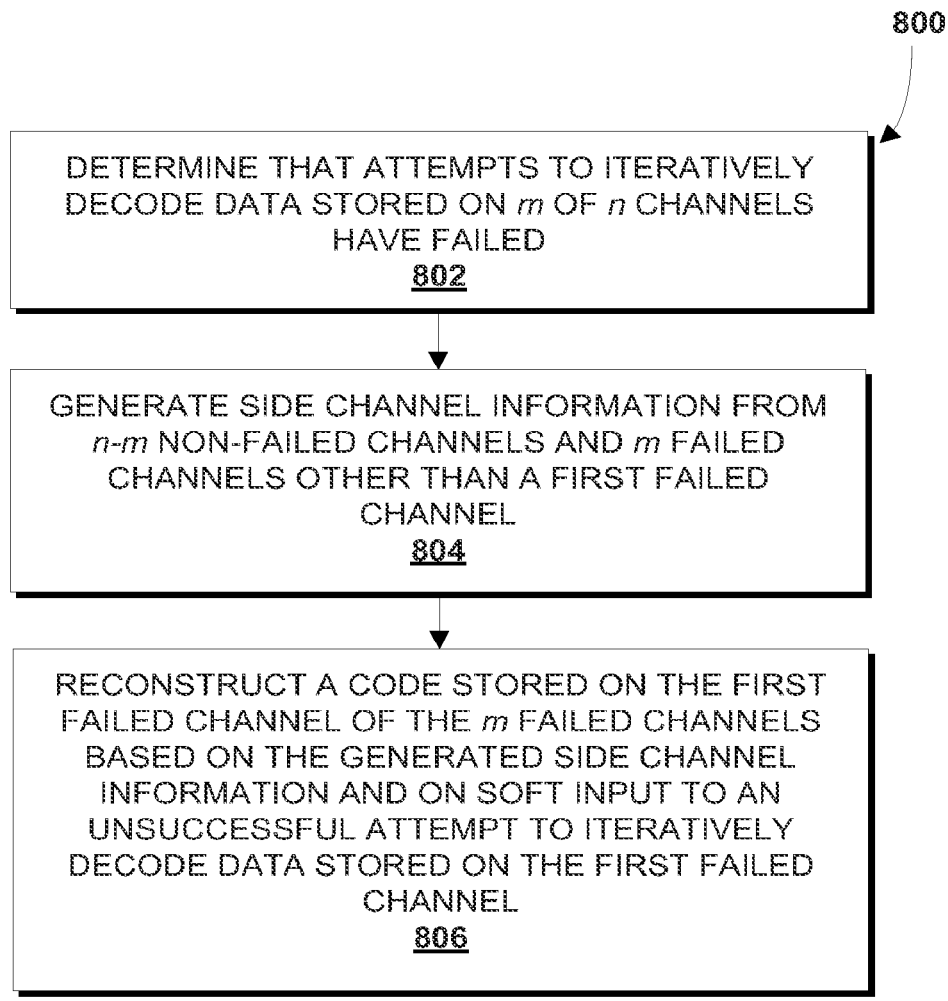
FIG. 8 schematically depicts an example method, in accordance with various embodiments.

FIG. 8 depicts an example method 800 that may be implemented by an iterative decoder, such as iterative decoder 20 of FIG. 1 or 2, or any of the other iterative decoders (320, 420, 520, 620, 720) described herein. At block 802, iterative decoder 20 may determine that attempts to iteratively decode data stored on m of n channels (e.g., die) have failed, m being an integer greater than 1.

At block 804, iterative decoder 20 may generate side channel information from n-m non-failed channels and/or the m failed channels other than a first failed channel. As described above and shown in FIGS. 3-7, the side channel information may be generated using various data associated with the n-m non-failed channels and/or the m failed channels other than the first failed channel.

At block 806, iterative decoder 20 may reconstruct a codeword stored on the first failed channel of the m failed channels based on the generated side channel information and on soft input to an unsuccessful attempt to iteratively decode data stored on the first failed channel.

Figure 9:
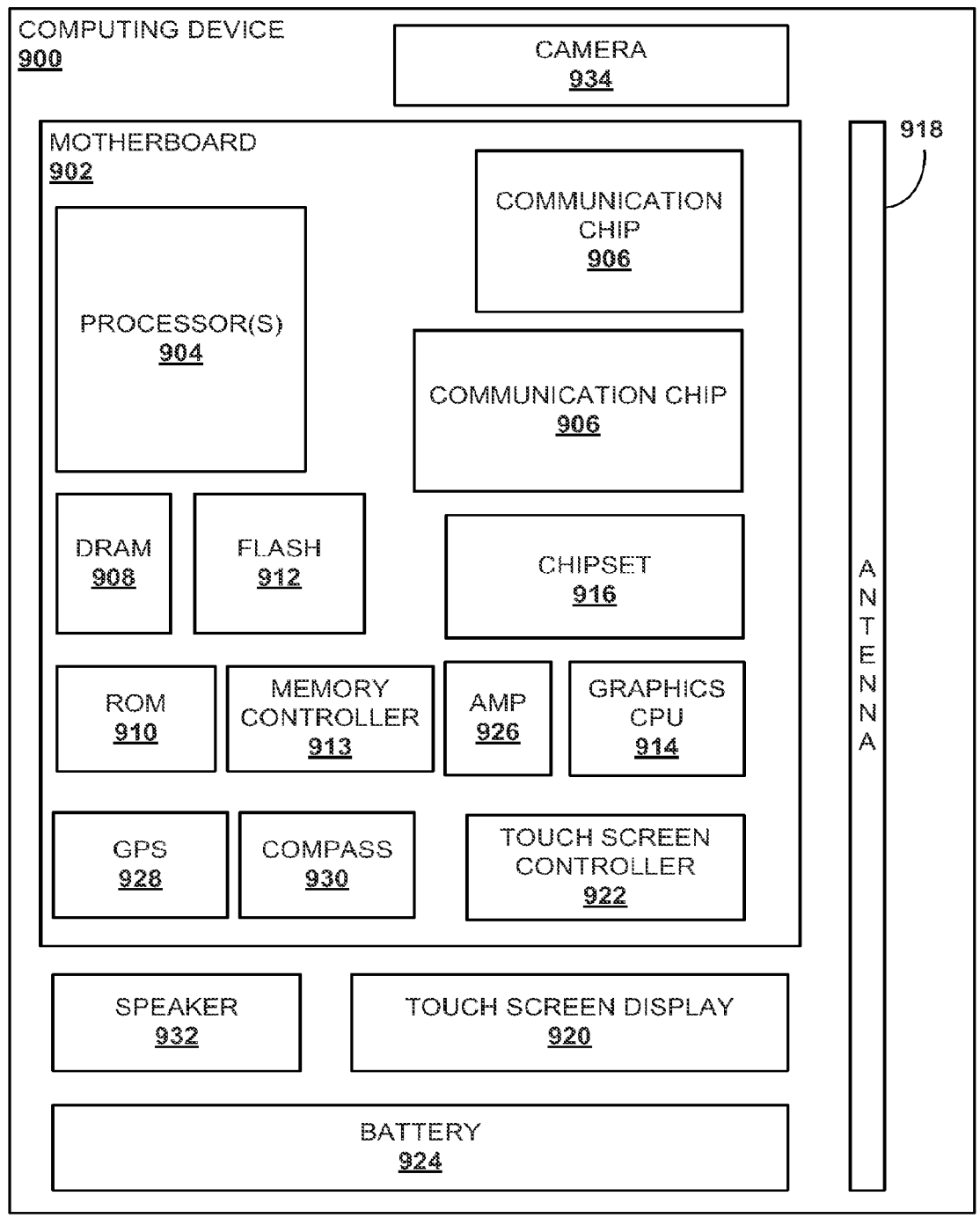
FIG. 9 schematically depicts an example computing device, in accordance with various embodiments.

FIG. 9 illustrates a computing device 900 in accordance with various embodiments. The computing device 900 houses a printed circuit board ("PCB") 902. The PCB 902 may include a number of components, including but not limited to a processor 904 and at least one communication chip 906. The processor 904 may be physically and electrically coupled to the PCB 902. In various embodiments, the at least one communication chip 906 may also be physically and electrically coupled to the PCB 902. In further implementations, the communication chip 906 may be part of the processor 904. In various embodiments, the processor 904 may be integrated on the same die with other components to form a System on Chip ("SoC").

Depending on its applications, computing device 900 may include other components that may or may not be physically and electrically coupled to the PCB 902. These other components include, but are not limited to, volatile memory (e.g., dynamic random access memory 908, also referred to as "DRAM"), non-volatile memory (e.g., read only memory 910, also referred to as "ROM"), flash memory 912, a memory controller 913, a graphics processor 914, a digital signal processor (not shown), a crypto processor (not shown), a chipset 916, an antenna 918, a display (not shown), a touch screen display 920, a touch screen controller 922, a battery 924, an audio codec (not shown), a video codec (not shown), a power amplifier 926, a global positioning system ("GPS") device 928, a compass 930, an accelerometer (not shown), a gyroscope (not shown), a speaker 932, a camera 934, and a mass storage device (such as hard disk drive, a solid state drive, compact disk ("CD"), digital versatile disk ("DVD")) (not shown), and so forth.

The communication chip 906 may enable wired and/or wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, Long Term evolution ("LTE"), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 may include an integrated circuit die packaged within the processor 904. In various embodiments, the integrated circuit die of the processor 904 may include one or more devices, such as transistors or metal interconnects, that are formed to facilitate iterative decoding of a codeword on a failed die using one or more techniques described herein. The term "processor" may refer to any device or portion of a device that processes electronic data from registers and/or memory to transform that electronic data into other electronic data that may be stored in registers and/or memory.

The communication chip 906 may also include an integrated circuit die packaged within the communication chip 906. In various embodiments, the integrated circuit die of the communication chip 906 may include one or more devices, such as transistors or metal interconnects, that are formed to facilitate iterative decoding of a codeword on a failed die using one or more techniques described herein.

In various implementations, the computing device 900 may be a laptop, a netbook, a notebook, an ultrabook, a smart phone, a tablet, a personal digital assistant ("PDA"), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

System, methods, computer-readable media (transitory and non-transitory), apparatus, devices and other various components may be configured to implement the following embodiments. In various embodiments, a memory controller may be configured to determine that m of n die of NVM have failed iterative decoding, m being an integer greater than 1. In various embodiments, the memory controller may be further configured to generate a side channel from n-m non-failed die and the m failed die other than a first failed die. In various embodiments, the memory controller may be further configured to reconstruct, using iterative decoding, a codeword stored on the first failed die of the m failed die based on the generated side channel and on soft input to an attempt to iteratively decode data stored on the first failed die. In various embodiments, the iterative decoding may include low-density parity-check decoding. In various embodiments, the n-m non-failed die may include an XOR die.

In various embodiments, the side channel includes hard output of one or more successful attempts to iteratively decode data stored on the n-m non-failed die. In various embodiments, the side channel may include soft output of one or more successful attempts to iteratively decode data stored on the n-m non-failed die. In various embodiments, the side channel may include hard output of one or more unsuccessful attempts to iteratively decode data stored on the m failed die other than the first failed die. In various embodiments, the side channel may include soft output of one or more unsuccessful attempts to iteratively decode data stored on the m failed die other than the first failed die.

In various embodiments, the side channel may include soft input to one or more attempts to iteratively decode data stored on the m failed die other than the first failed die. In various embodiments, the side channel may include hard input to one or more attempts to iteratively decode data stored on the m failed die other than the first failed die. In various embodiments, the side channel may include soft output of one or more unsuccessful attempts to iteratively decode data stored on the m failed die other than the first failed die, as well as information about trapping sets associated with the m failed die other than the first failed die.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising
a memory controller configured to:
determine that m of n die have failed iterative decoding, m being an integer greater than 1 and n being a positive integer;
generate a side channel from n-m non-failed die and the m failed die other than a first failed die; and
reconstruct, using iterative decoding, a codeword stored on the first failed die of the m failed die based on the generated side channel and on soft input to an attempt to iteratively decode data stored on the first failed die.

2. The apparatus of claim 1, wherein the iterative decoding comprises low-density parity-check decoding.

3. The apparatus of claim 1, wherein the n-m non-failed die include an XOR die.

4. The apparatus of claim 1, wherein the side channel comprises hard output of one or more successful attempts to iteratively decode data stored on the n-m non-failed die.

5. The apparatus of claim 1, wherein the side channel comprises soft output of one or more successful attempts to iteratively decode data stored on the n-m non-failed die.

6. The apparatus of claim 1, wherein the side channel comprises hard output of one or more unsuccessful attempts to iteratively decode data stored on the m failed die other than the first failed die.

7. The apparatus of claim 1, wherein the side channel comprises soft output of one or more unsuccessful attempts to iteratively decode data stored on the m failed die other than the first failed die.

8. The apparatus of claim 1, wherein the side channel further comprises soft input to one or more attempts to iteratively decode data stored on the m failed die other than the first failed die.

9. The apparatus of claim 1, wherein the side channel further comprises hard input to one or more attempts to iteratively decode data stored on the m failed die other than the first failed die.

10. The apparatus of claim 1, wherein the side channel comprises soft output of one or more unsuccessful attempts to iteratively decode data stored on the m failed die other than the first failed die, as well as information about trapping sets associated with the m failed die other than the first failed die.

11. A computer-implemented method, comprising:
   determining, by a memory controller, that m of n die have failed iterative decoding, m being an integer greater than 1; and
   reconstructing, by the memory controller, a codeword stored on a first failed die of the m failed die based on side channel generated from n-m non-failed die and the m failed die other than the first die, and on soft input to an attempt to iteratively decode data stored on the first failed die.

12. The computer-implemented method of claim 11, wherein the iterative decoding comprises low-density parity-check decoding.

13. The computer-implemented method of claim 11, wherein the n-m non-failed die include an XOR die.

14. The computer-implemented method of claim 11, wherein the side channel comprises hard output or soft output of one or more successful attempts to iteratively decode data stored on the n-m non-failed die.

15. The computer-implemented method of claim 11, wherein the side channel comprises hard output or soft output of one or more unsuccessful attempts to iteratively decode data stored on the m failed die other than the first failed die.

16. The computer-implemented method of claim 11, wherein the side channel further comprises soft input or hard input to one or more attempts to iteratively decode data stored on the m failed die other than the first failed die.

17. The computer-implemented method of claim 11, wherein the side channel comprises soft output of one or more unsuccessful attempts to iteratively decode data stored on the m failed die other than the first failed die, as well as information about trapping sets associated with the m failed die other than the first failed die.

18. A system, comprising:
   n channels with data; and
   an iterative decoder configured to:
      determine that m of n channels have failed attempts to iteratively decode data stored thereon, m being an integer greater than 1;
      generate a side channel from n-m non-failed channels and the m failed channels other than a first failed channel; and
   reconstruct a codeword stored on the first failed channel of the m failed channels based on the generated side channel and on soft input to an attempt to iteratively decode data stored on the first failed channel.

19. The system of claim 18, wherein the iterative decoder comprises a low-density parity-check decoder.

20. The system of claim 18, wherein the n-m non-failed channels include an XOR channel.

21. The system of claim 18, wherein the side channel comprises hard output or soft output of one or more successful attempts to iteratively decode data stored on the n-m non-failed channels.

22. The system of claim 18, wherein the side channel comprises hard output or soft output of one or more unsuccessful attempts to iteratively decode data stored on the m failed channels other than the first failed channel.

23. The system of claim 18, wherein the side channel further comprises soft input or hard input to one or more iterative attempts to iteratively decode data stored on the m failed channels other than the first failed channel.

24. The system of claim 18, wherein the side channel comprises soft output of one or more unsuccessful attempts to iteratively decode data stored on the m failed channels other than the first failed channel, as well as information about trapping sets associated with the m failed channels other than the first failed channel.

25. The system of claim 18, wherein the n channels comprise n die.

* * * * *